United States Patent
Spirkl et al.

(10) Patent No.: US 11,437,112 B2
(45) Date of Patent: Sep. 6, 2022

(54) MULTI-LEVEL SIGNALING FOR A MEMORY DEVICE

(71) Applicant: Micron Technology, Inc., Boise, ID (US)

(72) Inventors: Wolfgang Anton Spirkl, Germering (DE); Michael Dieter Richter, Ottobrunn (DE); Thomas Hein, Munich (DE); Peter Mayer, Neubiberg (DE); Martin Brox, Munich (DE)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 16/681,587

(22) Filed: Nov. 12, 2019

(65) Prior Publication Data

US 2020/0185049 A1    Jun. 11, 2020

Related U.S. Application Data

(60) Provisional application No. 62/776,089, filed on Dec. 6, 2018.

(51) Int. Cl.
  *G11C 29/10* (2006.01)
  *H04L 1/00* (2006.01)

(52) U.S. Cl.
  CPC ............ *G11C 29/10* (2013.01); *H04L 1/0003* (2013.01)

(58) Field of Classification Search
  None
  See application file for complete search history.

(56) References Cited

U.S. PATENT DOCUMENTS

| | | | |
|---|---|---|---|
| 8,166,379 B1* | 4/2012 | Wu ................... | H03M 13/658 714/794 |
| 10,056,903 B2* | 8/2018 | Amiri ............... | H03K 19/0005 |
| 10,128,842 B1 | 11/2018 | Lin | |
| 2003/0093713 A1* | 5/2003 | Werner ................ | G11C 11/56 714/25 |
| 2007/0245214 A1 | 10/2007 | Ramamoorthy | |
| 2011/0239084 A1* | 9/2011 | Abbasfar ........... | G06F 11/1004 714/758 |
| 2015/0378817 A1 | 12/2015 | Tsern et al. | |
| 2017/0212695 A1 | 7/2017 | Hollis et al. | |
| 2017/0289410 A1* | 10/2017 | Bin Abdullah ....... | G06T 5/20 |

FOREIGN PATENT DOCUMENTS

KR    20100090966 A    8/2010

OTHER PUBLICATIONS

ISA/KR, International Search Report and Written Opinion of the International Searching Authority, Int'l. Appl. No. PCT/US2019/063382, dated Mar. 19, 2020, Korean Intellectual Property Office, Seo-gu, Daejeon, Republic of Korea, 9 pgs.

* cited by examiner

*Primary Examiner* — April Y Blair
*Assistant Examiner* — Matthew W Wahlin
(74) *Attorney, Agent, or Firm* — Holland & Hart LLP

(57) ABSTRACT

Methods, systems, and devices for testing of multi-level signaling associated with a memory device are described. A tester may be used to test one or more operations of a memory device. The memory device may be configured to communicate data using a modulation scheme that includes three or more symbols. The tester may be configured to communicate data using a modulation scheme that includes three or fewer symbols. Techniques for testing the memory device using such a tester are described.

25 Claims, 12 Drawing Sheets

MULTI-LEVEL SIGNALING FOR A MEMORY DEVICE

CROSS REFERENCE

The present application for patent claims priority to U.S. Provisional Patent Application No. 62/776,089 by Spirkl et al., entitled "MULTI-LEVEL SIGNALING FOR A MEMORY DEVICE," filed Dec. 6, 2018, which is assigned to the assignee hereof, and which is expressly incorporated by reference in its entirety.

BACKGROUND

The following relates generally to a system that includes at least one memory device and more specifically to multi-level signaling for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory. e.g., FeRAM, may maintain their stored logic state for extended periods of time even in the absence of an external power source. Volatile memory devices, e.g., DRAM, may lose their stored state over time unless they are periodically refreshed by an external power source.

A memory device may be tested with a tester that includes one or more drivers for generating signals. In some cases, tester channels extend between the tester and the memory device and may be configured to allow the tester and the memory device to communicate.

DETAILED DESCRIPTION

Figure 1:
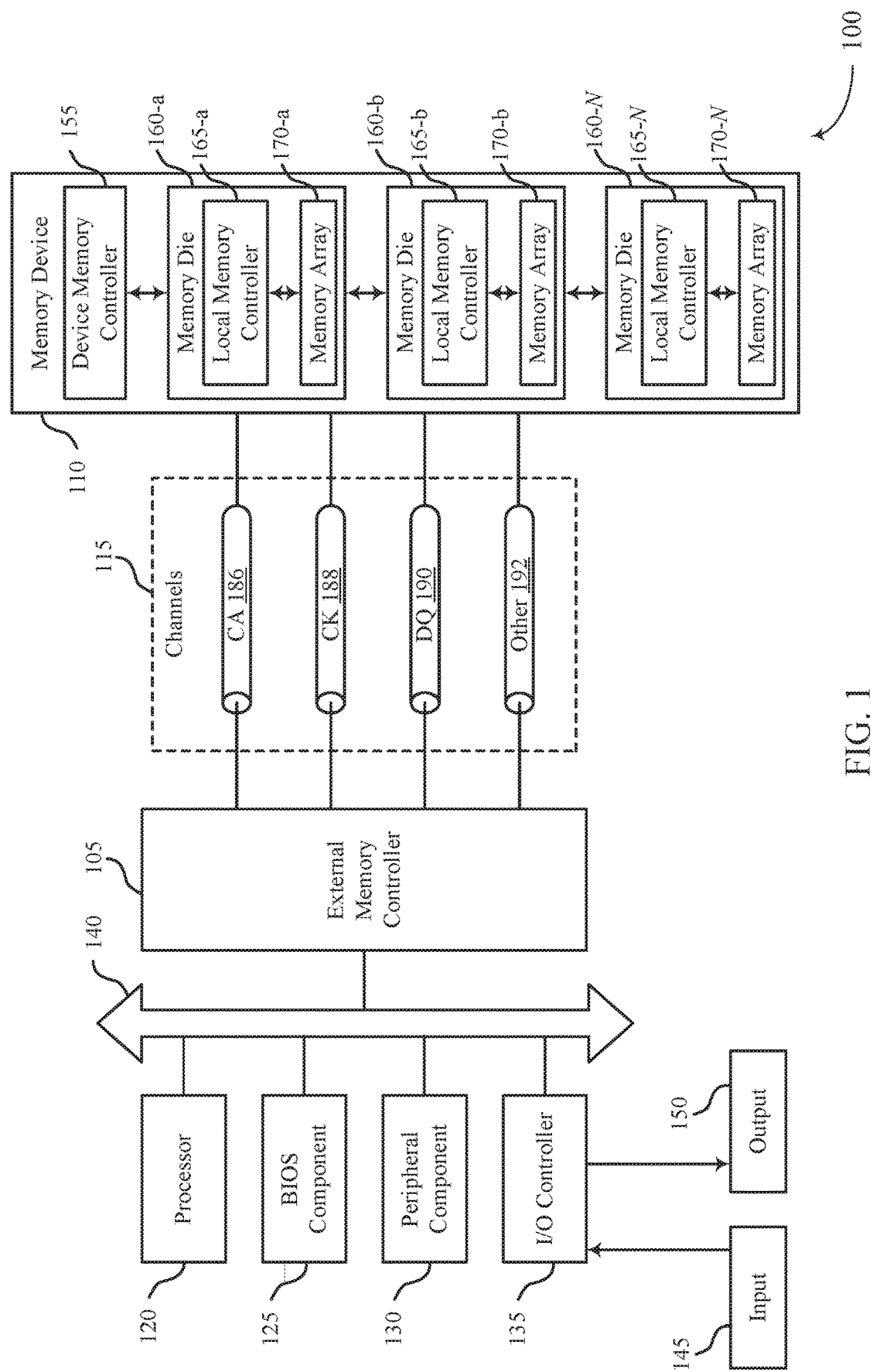
FIG. 1 illustrates an example of a system that supports multi-level signaling for a memory device in accordance with examples as disclosed herein.

Some memory systems may include a host device and a memory device configured to store data of the host device. In some examples, the memory device may be configured to transmit and/or receive signals that are modulated using a modulation scheme having three or more levels—e.g., four-level pulse amplitude modulation (PAM4), In some cases, testers (or testing devices) configured to test the memory device may not include drivers and/or receivers for communicating signals modulated using the modulation scheme having three or more levels. In such cases, the testers may include drivers and/or receivers for communicating signals modulated using a second modulation scheme having two levels PAM2 or non-return-to-zero (NRZ). It may be desirable to configure the testers to test a wider range of signaling capable by the memory device.

A tester configured to transmit and/or receive signals modulated using the second modulation scheme having two levels may be operable to test the capabilities of a memory device that is configured to transmit and/or receive signals that are modulated using a modulation scheme having three or more levels. The testers may test one or more aspects of the memory device, such as the ability of the memory device to receive full swing levels or symbols of data, whether received levels or symbols at the memory device may interfere with one another (e.g., inter symbol interference, ISI), cross-talk, and so forth. In some cases, a tester may individually test some of the memory device characteristics, may test the memory device using multi-pass techniques, tri-state drivers, dual and triple transmission lines. In some cases, depending on the configuration, the tester may provide signaling to the memory device that constructively tests the ability of the memory device to store and/or communicate PAM4 data.

In some cases, a memory device may receive a first symbol and a second symbol from a tester using signals modulated with the second modulation scheme having two levels. The memory device may translate the first symbol and the second symbol into a third symbol and thereby identify a symbol associated with the first modulation scheme having three or more levels. In some cases, translating the symbols may include using a mapping between symbol combinations of the second modulation schema and symbols of the first modulation scheme. In some cases, the mapping may be configured for use for all pins or may be configured individually for each pin of a memory device.

Features of the disclosure are initially described in the context of a memory system as described with reference to FIGS. 1 and 2. Features of the disclosure are described in the context of a system and a testing configuration for multi-level signaling for a memory device as described with reference to FIGS. 3 through 8. These and other features of the disclosure are further illustrated by and described with reference to flowcharts that relate to multi-level signaling for a memory device as described with reference to FIGS. 9 through 12.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system TOO or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, memory device 110 may receive be tested using a tester that includes at least a driver and a comparator. The memory device may receive PAM4 data patterns, but may be tested using a PAM2 tester. The test system configurations will be described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105, For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other components of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 163 may in some cases be performed by the external memory controller 105 (either separate from or as included in the processor 120).

The components of the system 100 may exchange information with the memory device 110 using a plurality of channels 115. In some examples, the channels 113 may enable communications between the external memory controller 103 and the memory device 110. Each channel 115 may include one or more signal paths, conductive lines, or transmission mediums (e.g., conductors) between terminals associated with the components of system 100. For example, a channel 113 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 135, memory dice 160, local memory controllers 165, memory arrays 170). In some examples, the memory device 110 may include data pins for receiving data. These data pins may be employed in write and read operations, as well as for testing the memory device. In some examples, the memory device 110 may be coupled to a tester. The tester may communicate with the memory device using tester conductive lines that may be coupled with the memory device data pins. In some cases, a single conductive line from the tester may be coupled with a single memory device data pin, two conductive lines from the tester may be coupled with the single memory device data pin, or three conductive lines from the tester may be coupled with the single memory device data pin. The conductive lines may communicate signals to the memory device via the memory device data pins.

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others. In some examples, a memory device that is configured to transmit or receive a signal modulated using a PAM4 modulation scheme may be tested using a tester that is configured to transmit or receive a signal modulated using a PAM2 modulation scheme.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols. In some examples, it may be desirable to test a memory device capable of communicating signals modulated using a multi-symbol modulation scheme using a driver that is configured to generate signals using a binary-symbol modulation scheme.

Figure 2:
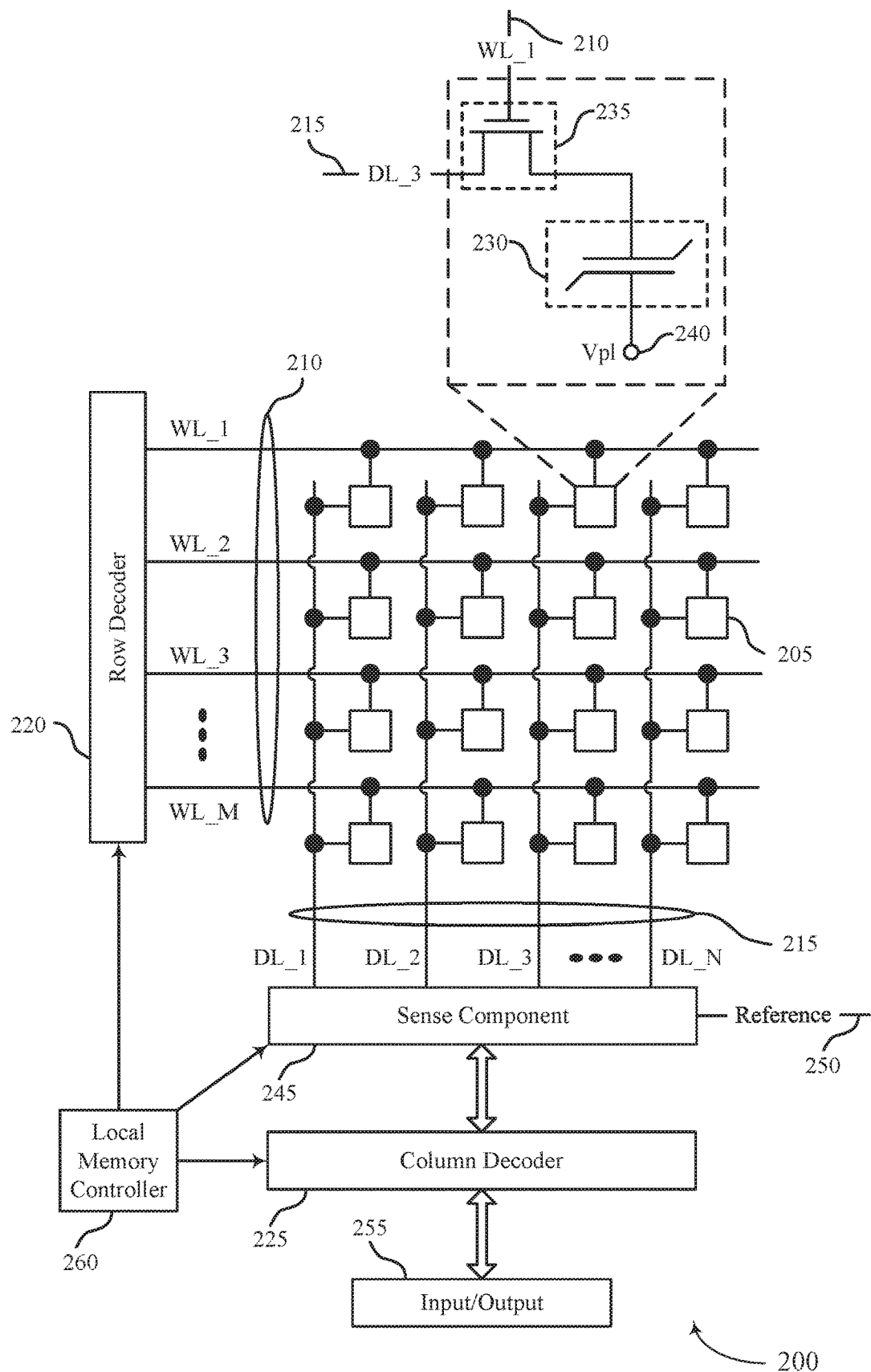
FIG. 2 illustrates an example of a memory die that supports multi-level signaling for a memory device in accordance with examples as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, W_1 and DL_3, the memory cell 205 at their intersection may be accessed. The intersection of a word line 210 and a digit line 215, in either a two-dimensional or three-dimensional configuration, may be referred to as an address of a memory cell 205. In some examples, the memory device 110 may be tested with a tester which may access the individual memory cells and communicate signaling to the memory devices.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vp1, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 5 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1, In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current described herein may be adjusted or varied and may be different for the various operations described in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal voltage) to the digit line 215 during the write operation to store a specific state (e.g., charge) in the capacitor 230 of the memory cell 205, the specific state (e.g., charge) may be indicative of a desired logic state.

In some examples, the memory device 110 may be tested by writing data to the memory device 110 provided by a tester. The tester may be coupled with the memory device and may communicate using PAM2 signaling, but test PAM4 patterns on the memory device. The tester may test the memory device by analyzing full swing data patterns, adjacent levels, nearly adjacent levels, multi-pass writing techniques, tri-state drivers and so forth.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

Figure 3:
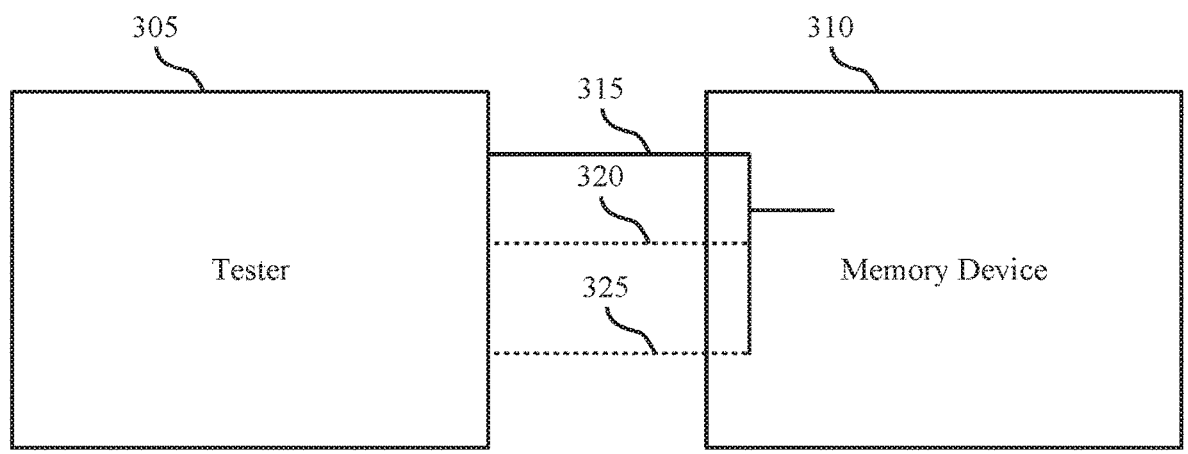
FIG. 3 illustrates an example of a system that supports multi-level signaling for a memory device in accordance with examples as disclosed herein.

FIG. 3 illustrates an example of a system 300 that supports multi-level signaling for a memory device in accordance with examples as disclosed herein. The system 300 may include a tester 305 and a memory device 310. In some examples, the memory device 310 may be an example of the memory die 200 described with reference to FIGS. 1 and 2.

The system 300 may include a memory device 310 that may be coupled with a tester 305. In some examples, the tester 305 may include drivers and comparators. The tester 305 may communicate with the memory device 310 via conductive line 315, and in some cases, via conductive lines 320, and 325. Although three conductive lines are illustrated in FIG. 3, any quantity of conductive lines may be used to communicate information between the tester 305 and the memory device 310. As depicted in FIG. 3, the conductive lines 315, 320, and 325 may carry signaling between the tester 305 and a first data pin of the memory device 310. Additionally, the conductive lines 320 and 325 may be coupled with a second and third data pin of the memory device 310. In some examples, any quantity of the three conductive lines 315, 320, and 325, may be coupled with a single data pin of the memory device.

In some examples, the memory device 310 may be capable of receiving a signal modulated using a modulation scheme that includes two levels, the signal being communicated over the conductive line 315. In some examples, the memory device 310 may be capable of receiving a signal modulated using a modulation scheme that includes three or more levels. In some examples, the memory device 310 may be configured to receive and/or transmit using PAM4 signaling. It may be desirable to test PAM4 data patterns on the memory device 310 using PAM2 drivers and/or comparators of the tester 305.

In some examples, the tester 305 may be an example of automated test equipment (ATE). The tester 305 may include a power supply, a signal generator, a digital pattern generator, a pulse generator, a processor, a memory, a controller, or any combination thereof. The tester 305 may be an oscilloscope, frequency counter, or any other appropriate device which may analyze the response of the memory device 310. The tester 305 may include receivers for demodulating signals received from the memory device 310, decoders for modulating and transmitting signals to the memory device 310, logic, decoders, amplifiers, filters, or the like, or any combination thereof. The tester 305 may be hardware, firmware, or software, or some combination thereof and may be implemented by the processor or other components of the systems described herein.

Figure 4:
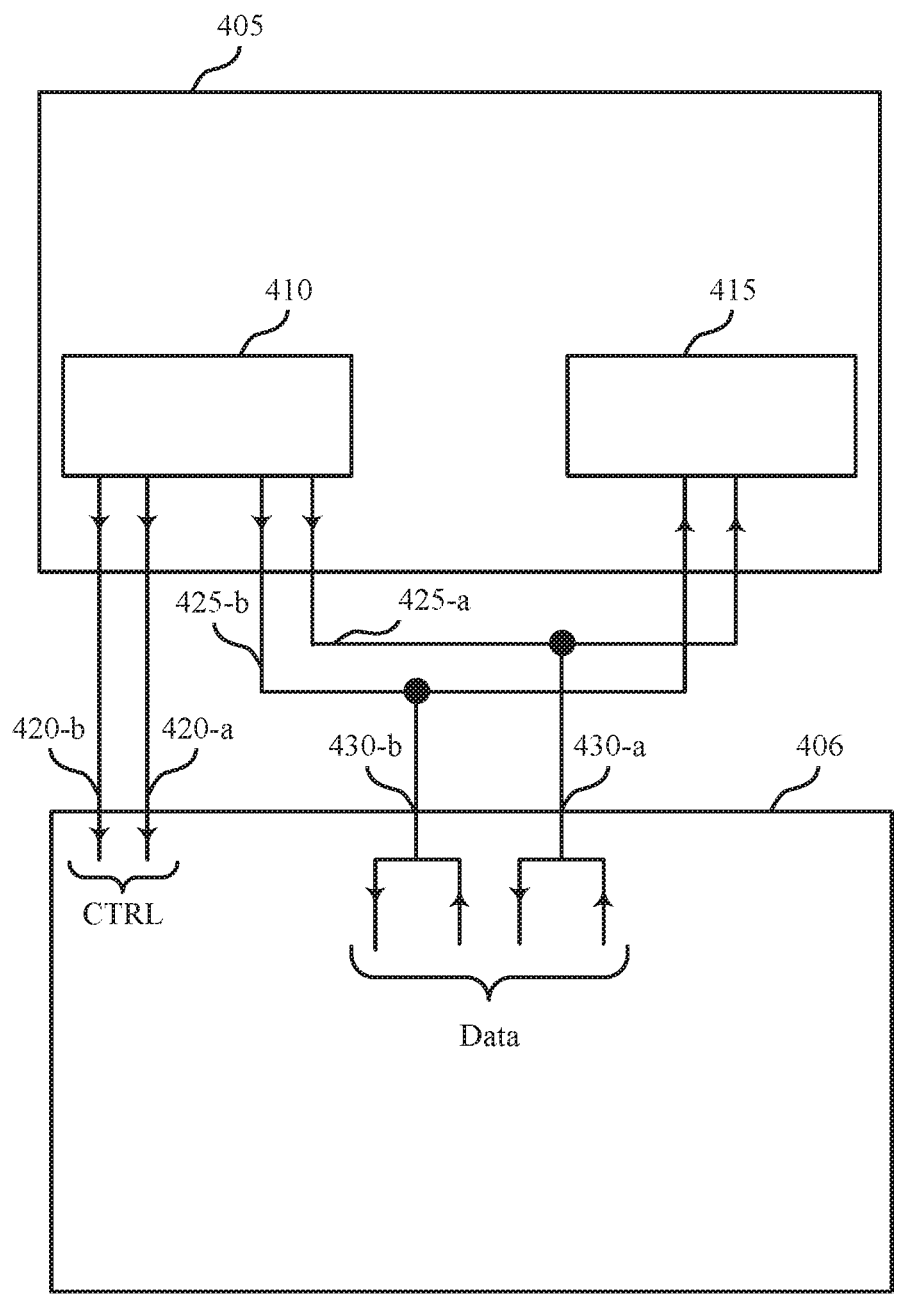
FIG. 4 illustrates an example of a system that supports multi-level signaling for a memory device in accordance with examples as disclosed herein.

FIG. 4 illustrates an example of a system 400 that supports multi-level signaling for a memory device in accordance with examples as disclosed herein. The system 400 may include a tester 405 and a memory device 406. In some examples, the tester 405 may be an example of the tester 305 described with reference to FIG. 3. In some examples, the memory device 406 which may be examples of the memory devices 110 and 310 or memory die 200 described with reference to FIGS. 1 through 3.

The system 400 may include a memory device 406 and a tester 405. In some examples, memory device 406 may be configured to transmit or receive signaling with the tester 405 or other devices (e.g., a host device). The signaling may include one symbol per time slot, where the symbol may be one of two levels. This type of signaling may be referred to herein as PAM2 signaling or NRZ signaling. In some examples, a memory device 406 may receive signaling where one symbol per time slot may be one of three levels, four levels, or more and may represent two or more bits of digital logic. In some cases, such signaling may be referred to as PAM 4 signaling.

In some examples, a tester 405 may include one or more drivers 410 and one or more comparators 415. Although a single driver 410 and comparator 415 may be depicted in FIG. 4, multiple drivers and comparators may be used in the system 400 to test memory device 406. The driver 410 may communicate with the memory device 310 using conductive lines. As used herein, a conductive line may be an example of a tester channel, where the tester channel may be lines connected between the tester 405 and the memory device 406. Conductive lines 420-*a* and 420-*b* may be control lines that communicate control signals between the tester 405 and the memory device 406. In some examples, the control lines of the tester 405 may communicate control information that may be received at control pins on the memory device 406. The control information may provide addresses, activation information, and so forth. The conductive lines 425-*a* and 425-*b* may be data lines that communicate data signals between the tester 405 and the memory device 406. The memory device 406 may receive the signaling over data lines 430-*a* and 430-*b*. Data lines 430-*a* and 430-*h* may be data pins on the memory device 406. In some examples, memory device 406 may transmit data to the tester 405 via the data lines 430-*a* and 430-*b*. In some examples, an access command may request data and may be received at the memory device 406. The memory device 406 may provide the data to the requesting device by transmitting the data on the data lines 430-*a* and 430*b*.

In some examples, the system 400 may include one PAM2 driver 410 per memory device 406 data line to modulate a signal between two levels. By providing one PAM2 driver per data line, a full PAM4 signal may not be possible to be communicated as the memory device 406 may be configured to receive four levels and the PAM2 driver may provide two levels. In some examples, a PAM2 driver 410 may be capable of providing a full swing of levels associated with a PAM4 signal. For example, a PAM2 driver 410 may be configured to output a first voltage associated with a lowest level of a PAM4 signal and output a second voltage associated with a highest level of a PAM4 signal. In some examples, a full swing of levels associated with a signal may be the lowest signal and the highest signal that the device may be capable of transmitting or receiving. In other examples, the PAM2 driver may be capable of generating any voltage associated with any level associated with a PAM4 signal or any other modulation scheme that uses three or more levels. Even though providing a full swing of levels may not provide a PAM4 signal, the tester 405 or the memory device 406 may be capable of using the full swing of levels to determine some information about whether the tummy device 406 is functioning properly. In some examples, it may be detected that the lowest level may be at a border of detection. In some examples, it may be possible to check for inter symbol interference (ISI), such as from an echo of a previous level or symbol.

In some examples, the PAM2 driver 410 may provide adjacent levels. In such examples, a modulation scheme that includes three or more levels may be configured with a first level (e.g., lowest level), a second level (e.g., a lower-intermediate level), a third level (e.g., a higher-intermediate level) or a fourth level (e.g., a highest level). The PAM2 driver may be configured to generate a PAM2 signal that uses any combination of the levels or symbols associated with the modulation scheme that includes three or more levels. In some examples, the tester may generate signaling to test specific symbol transitions. In some examples, the tester may generate signaling such as a zero level to a one level to specifically test the transition from zero to one. In some examples, the tester may generate signaling such as a one level to a two level to specifically test the transition from one to two and so forth. In yet other examples, the tester may generate signaling to a transition from the zero level to the two level. Any combination of symbols or symbol transitions may be generated by the tester. The memory device 406 may include a slicer, which may determine whether the signal is high or low. In some examples, the memory device 406 may include two slicers for PAM2 signaling or PAM4 signaling. In some examples, the memory device slicers may be adjusted by changing the reference voltage or reference signal of the memory device slicer so that it may determine what level is a signal is modulated to, including distinguishing between a first level and a second level, a second level and a third level, or a third level and a fourth level.

In some examples, the PAM2 driver may not be capable of providing a full swing of levels and instead, may provide nearly adjacent levels such as a 0 level and a 1 level, a 0 level and a 2 level, and a 2 level and a 3 level. Even though the tester 405 may not be capable of providing a PAM4 signal, it may be possible to test and characterize each range with a high level of precision and reliability.

In some examples, even though the PAM2 driver may be capable of providing two levels, the different tester channels of the PAM2 driver may be programmed to provide different levels. In some examples, the tester 405 may have the capability to switch between level 0 and level 3 and different levels may be used for different data lines. A first data pin of the memory device 406, DQ1, may be used for victim signals (e.g., signals that carry data at typical performance conditions), while a second data pin, DQ0, and a third data pin, DQ2, may be used for aggressor signals (e.g., signals configured to interfere with neighboring signals for testing purposes). In this example, three tester channels may be used with three data lines.

In some examples, a first signal may induce signals on other conductive lines and a second signal may be interfered with by the first signal, and the second signal may be modulated using a PAM4 modulation scheme. This may be an example of providing a PAM2 signal to test interference of signals modulated using a PAM4 modulation scheme.

Two tester channels may be combined into a single tester channel to provide four levels with a dual-transmission line. A dual-transmission line may include two lines from the tester 405, which may be connected to one data pin on the memory device 406. A triple transmission line may include three lines from the tester 405, which may be connected to one data pin on the memory device 406. In some examples, data masking may be employed to write PAM4 data by writing to the memory device 406 with two or more passes of PAM2 data. The tester 405 may transmit some bits to the memory device 406, which may be written into the memory device 406. In some cases, the bits may be written in multiple passes using PAM2 signaling, but the signaling may be read as PAM4 signaling. In some examples, a first bit may be written to the memory device 406, then the tester level may be changed and the next bit may be written to the memory device, and this next bit may be a higher level than the first bit. By writing multiple times to the memory device 406 (e.g., writing twice to the memory device 406), full PAM4 data may be written into memory. Although this may take longer to write data, any data pattern may be written to the memory device 406 with multi-pass writing. In some examples, the tester 405 may change levels within the test run during a quiet phase. This may be employed to first write levels 0 and 1, and then write levels 2 and 3.

In some examples, the driver 410 may be a tri-state driver, which may be configured to generate a signal that is modulated using a modulation scheme that includes three levels. In this example, any of the techniques described herein, may be employed in conjunction with a tri-state driver. The three levels of the tri-state driver may include a high level, a low level, and a mid-level which may fall between the high level and the low level. In some examples, it may be decided which three levels of the four levels of PAM4 signaling may be used for testing. In some examples, a first test may employ the first level, second level, and the third level. A second test may employ different levels than the first test (e.g., the second level, third level, and fourth level). Any combination of levels may be employed by a test using the tri-state driver. Different tests may use different levels until the appropriate quantity of combinations may be provided for testing the input into the memory device 406 (e.g., testing a PAM4 input). Advantageously, the PAM4 input may be captured in two passes using three levels, where using adjacent levels or two levels, three passes may be used to achieve a PAM4 input.

In some examples, two PAM2 drivers may be used as a PAM4 driver by using PAM2 tester channels of the tester 405 to transmit to a single data line of the memory device 406. In some examples, dual-transmission lines, triple transmission lines, or any number of appropriate transmission lines, may be employed with the two P2 drivers and existing tester channels. The configuration of the drivers, tester channels, and data lines of the memory device may depend on the capabilities of the tester channels. For example, the tester channels may be input/output or input or output. In some examples, each tester channel may be input or output and a triple transmission line configuration may be employed. In this example, two of the tester channels may provide the PAM4 input to the memory device 406 and one, two, or three of the tester channels may be used to receive the signal from the memory device 406. In some examples, the tester 405 may be bidirectional. In this example, another driver may be added next to the comparator 415 of the tester 405, or additionally or alternatively, an additional comparator may be added next to the driver 410 of the tester 405. In these examples, during a read operation, comparators may be provided in parallel. In some examples, an additional driver may be added next to both the comparator 415 and the driver 410 in conjunction with the use of a triple transmission line. In FIG. 4, tester channels may both transmit and receive in the tester 405.

In some examples PAM2 tester channels may be used to generate aggressor signals configured to cause interference with one or more victim signals communicated across other conductive lines. Using aggressor signals and victim signals, the tester 405 any be capable of testing the performance of the memory device 406 under adverse conditions. In some examples, a DQ1 data pin of the memory device 406 may receive a PAM4 tester channel, and the other tester channels received by the memory device 406 may be PAM2 tester channels. The PAM2 signals transmitted on the tester channels may be received by the memory device as fill swing levels and the PAM tester channel signaling may be received at the memory device as the victim levels, such that any sequence may be programmed with any level arbitrarily to provide the appropriate symbols to the memory device 406. In some examples, the full swing levels may be the highest and lowest level that the memory device is capable of receiving or the highest and lowest level that the tester channel may be configured to transmit to the memory device. Because aggressor tester channels may be driven by the maximum allowed swing, a maximum level of cross talk may be created to the victim tester channels. In some examples, the worst case cross talk for victim tester channels may not be clear due to the influence of ISI. In some cases, a signal modulated using a modulation scheme that includes three or more levels may be used as a victim signal.

The tester 405 may write data to the memory device 406 multiple times (e.g., twice) using a PAM2 signal to achieve a PAM4 pattern stored in one or more memory cells of the memory device 406. In some examples, a PAM2 pattern may be written to the memory device 406 and a look-up table may be used to create a PAM4 pattern in the memory device 406. In some examples, a PAM2 tester channel may write half of the bits for a PAM4 pattern and the look-up table may be used to load the remaining bits. In some examples, the look-up table may be programmed to communicate to the memory device 406 using control signals and may instruct the memory device 406 to change the look-up table and then write the remaining hits. In the case that the driver may write adjacent levels (e.g., a 0 level and a 1 level), the look-up table may be used to create a maximum level swing in the memory device 406. Even though the driver may be providing small swings, the look-up table may translate the levels internally to the memory device 406 such that from the memory device perspective, it may appear that a full swing of levels 0 and 3 were written. The translated levels may additionally be read from the memory device as levels 0 and 3 even though levels 0 and 1 may have been written by the tester 405.

In some examples, a tester 405 may provide two adjacent levels, the first level and the second level and the test system may be configured for the memory device 406 to receive the first level and the second level. In some examples, even though the tester 405 may provide the first level and the second level, the memory device 406 may receive the third level and the fourth level. Because these are unexpected levels, the memory device 406 may be able to detect this as an error.

Figure 5:
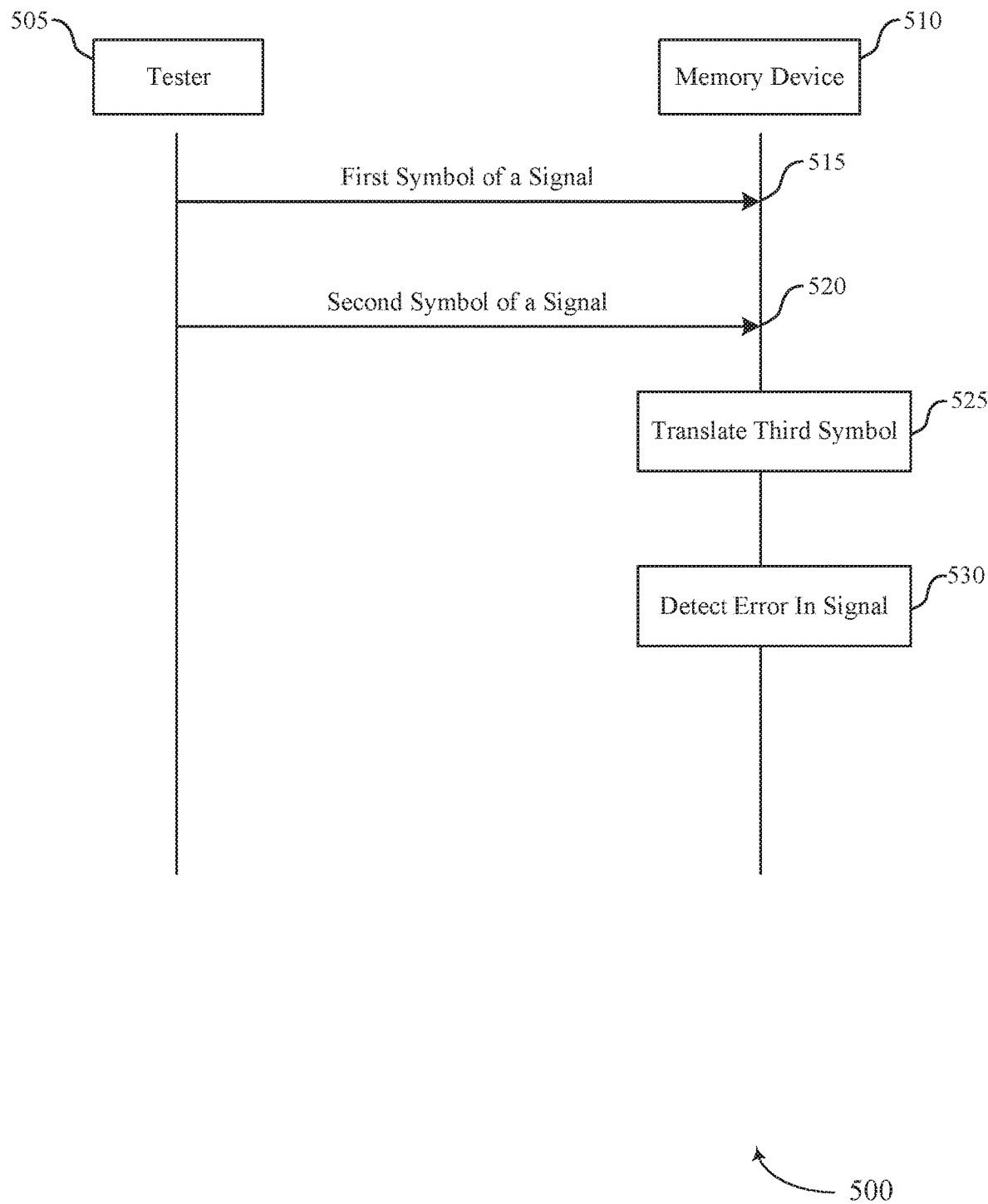
FIG. 5 illustrates an example of a process flow that supports multi-level signaling for a memory device in accordance with examples as disclosed herein.

In some examples, the look-up table may be implemented per memory device pin. In some examples, the look-up table may be programmed for all memory device pins such that every memory device pin has the same look-up table, such that the look-up table may convert all the memory device pins together, FIG. 5 illustrates an example of a process flow 500 that supports multi-level signaling for a memory device in accordance with examples as disclosed herein. The process flow 500 may illustrate functions of and communications between a tester 505 and a memory device 510. In some examples, the tester 505 may be an example of the testers 305 or 405 described with reference to FIGS. 3 and 4. In some examples, the memory device 510 which may be examples of the memory devices 110, 310, 406 or memory die 200 described with reference to FIGS. 1 through 4.

In some examples, the tester 505 may be an ATE. At 515 the memory device 510 may receive a first symbol of a signal that may be modulated using a first modulation scheme that may include three or fewer levels.

At 520, the memory device 510 may receive a second symbol that may be modulated using a first modulation scheme that may include three or fewer levels.

At 525, the memory device 510 may translate the first symbol and the second symbol into a third symbol associated with a second modulation scheme which may include at least four levels.

At 530, the memory device 510 may detect an error in the signal which may be at least partially based on translating the third symbol.

In some examples, the first and second symbol of a signal may be received by the memory device 510 and the memory device may translate the two received symbols to other symbols (e.g., a third and a fourth symbol), such that new data sequences may be achieved when reading the data back from the memory device 110.

In some examples, the first and second symbol of a signal may be received by the memory device 510 and the memory device may identify a third symbol associated with a second modulation scheme that includes at least four levels. Additionally, an error may be detected in the signal based at least partially on identifying the third symbol.

Similar to the description in FIG. 4, in FIG. 5, the tester 505 may write the memory device 110 multiple times (e.g., twice) using a PAM2 signal to achieve a PAM4 pattern in the memory device 110. In some examples, the tester 505 may write the memory device 110 one symbol at a time, multiple times (e.g., a first symbol at a first time and a second symbol at a second time) using a PAM2 signal, to achieve a PAM4 pattern in the memory device 110. This may be achieved by any of the methods discussed herein. In some examples, a PAM2 pattern may be written to the memory device 110 and a look-up table may be used to create a PAM4 pattern at the memory device 110.

In some examples, the driver may write adjacent levels (e.g., a 0 level and a 1 level), the look-up table may be used to create a maximum level swing in the memory device 110. Even though the driver may be providing small swings, the look-up table may translate the levels internally to the memory device 110 such that from the memory device perspective, it may appear that a fill swing of levels 0 and 3 were written. The translated levels may additionally be read from the memory device as levels 0 and 3 even though levels 0 and 1 may have been written by the tester 505.

In some examples, a tester 505 may provide two adjacent levels, level 0 and level 1 and the test system may be configured for the memory device 110 to receive level 0 and level 1. In some examples, even though the tester 505 may provide levels 0 and 1, the memory device 110 may receive levels 2 and 3. Because these are unexpected levels, the memory device may be able to detect this as an error.

Figure 6:
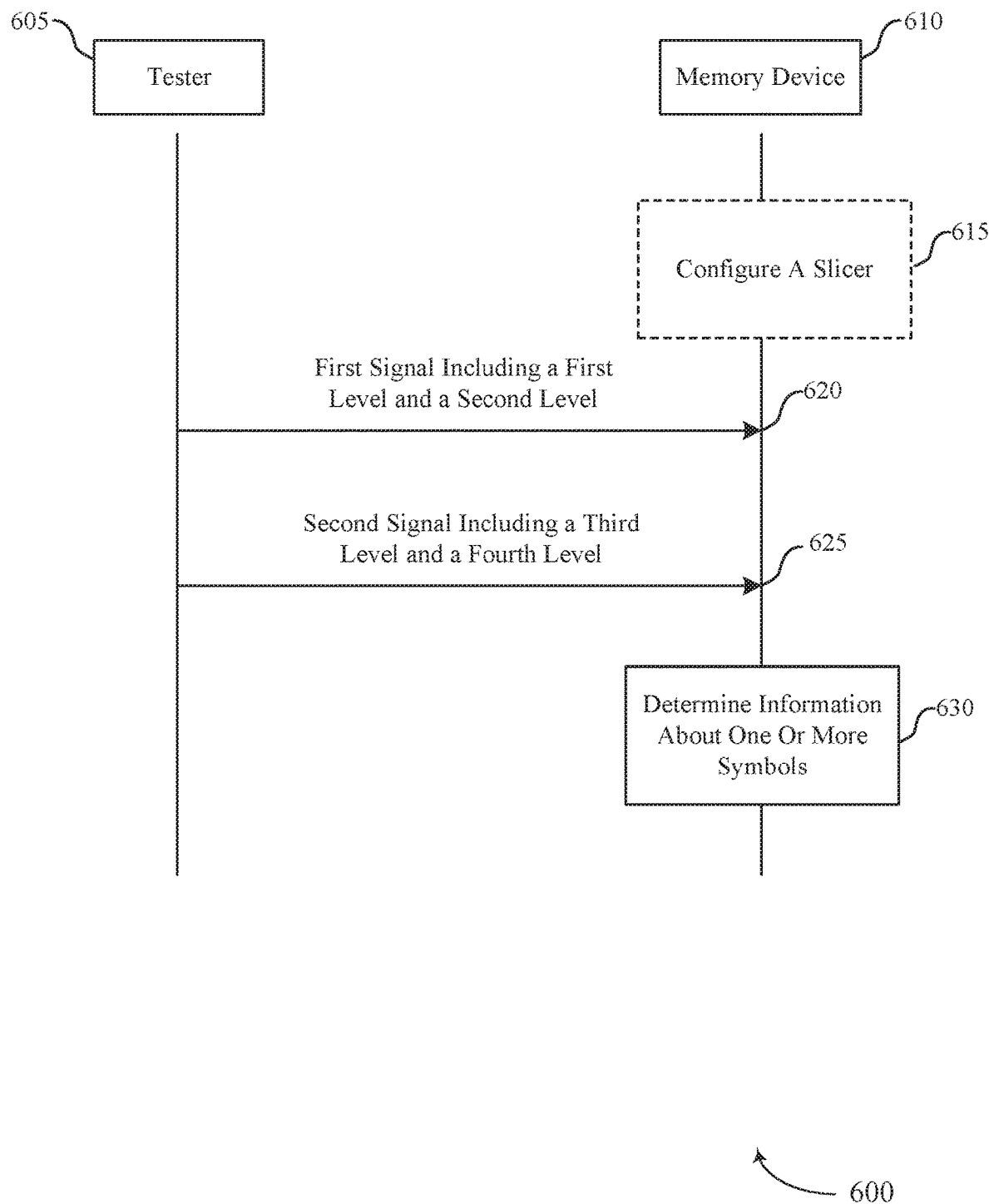
FIG. 6 illustrates an example of a process flow that supports multi-level signaling for a memory device in accordance with examples as disclosed herein.

FIG. 6 illustrates an example of a process flow 600 that supports multi-level signaling for a memory device in accordance with examples as disclosed herein. The process flow 600 may illustrate functions of and communications between a tester 605 and a memory device 610. In some examples, the tester 605 may be an example of the testers 305, 405, or 505 described with reference to FIGS. 3, 4, and 5. In some examples, the memory device 610 which may be examples of the memory devices 110, 310, 406 or memory die 200 described with reference to FIGS. 1 through 4. In some examples, the tester 605 may be ATE. At 615, a slicer of the memory device 610 may be configured. A slicer may compare a value of a signal during a specific time interval to a reference voltage or reference signal and thereby determine, at least partially, a level of the signal during the specific time interval (e.g., whether a signal may be high or low).

At 620, the memory device 610 may receive, a first signal transmitted over a first conductive line of a plurality of conductive lines. The first signal may include a first level and a second level and may be modulated using a first modulation scheme having three or fewer levels.

At 625, the memory device 610 may receive, a second signal transmitted over a second conductive line of the plurality of conductive lines. The second signal may include a third level and a fourth level and may be modulated using the first modulation scheme.

At 630, the memory device 610 may determine information about one or more symbols of a second modulation scheme having at least four levels, and which may be at least partially based on receiving the first signal and receiving the second signal. The memory device 610 may be operable to receive one or more signals that may be modulated using the second modulation scheme, which may be PAM4.

The tester 605 may include one PAM2 driver per memory device 610 data line to switch between two levels. By providing one PAM2 driver per data line that may switch between two levels, a full PAM 4 data store may not be possible as the memory device 610 may be configured to receive four levels and the PAM2 driver may provide two levels. In some examples, a PAM2 driver of the tester 605 may be capable of providing a full swing of levels, and may provide a full swing of levels, for example, a 0 level and a 3 level.

In some examples of FIG. 6, the PAM2 driver of tester 605 may provide adjacent levels. In such examples, a modulation scheme that includes three or more levels may be configured with a first level (e.g., lowest level), a second level (e.g., a lower-intermediate level), a third level (e.g., a higher-intermediate level) or a fourth level (e.g., a highest level). The PAM2 driver may be configured to generate a PAM2 signal that uses any combination of the levels or symbols associated with the modulation scheme that includes three or more levels. In this example, the memory device 610 may include a slicer, which may determine whether the signal is high or low. In some examples, the memory device 610 may include two slicers for PAM2 signaling or PAM4 signaling. In some examples, the memory device slicers may be adjusted by changing the reference voltage or reference signal of the memory device slicer so that it may determine what level is a signal is modulated to, including distinguishing between a first level and a second level, a second level and a third level, or a third level and a fourth level.

In some examples, the PAM2 driver may not be capable of providing a full swing of levels and instead, may provide nearly adjacent levels such as a 0 level and a 1 level, a 0 level and a 2 level, and a 2 level and a 3 level. Even though the tester 605 may not be capable of providing a PAM4 signal, it may be possible to test and characterize each range with a high level of precision and reliability.

In some examples, even though the PAM2 driver may be capable of providing two levels, the different tester channels of the PAM2 driver may be programmed to provide different levels. In some examples, the tester 405 may have the capability to switch between level 0 and level 3 and different levels may be used for different data lines. A first data pin of the memory device 610, DQ1, may be used for victim signals (e.g., signals that carry data at typical performance conditions), while a second data pin, DQ0, and a third data pin, DQ2, may be used for aggressor signals (e.g., signals configured to interfere with neighboring signals for testing purposes). In this example, three tester channels may be used with three data lines.

Two tester channels may be combined into a single tester channel to provide four levels with a dual-transmission line. In some examples, data masking may be employed to write PAM4 data by writing to the memory device 610 with two or more passes of PAM2 data. The tester 605 may transmit some bits to the memory device 406, which may be written into the memory device 610. In some cases, the bits may be written in multiple passes using PAM2 signaling, but the signaling may be read as PAM4 signaling. In some examples, a first bit may be written to the memory device 610, then the tester level may be changed and the next bit may be written to the memory device 610, and this next hit may be a higher level than the first bit. By writing multiple times to the memory device 610 (e.g., writing twice to the memory device 610), full PAM4 data may be written into memory. Although this may take longer to write data, any data pattern may be written to the memory device 610 with multi-pass writing. In some examples, the tester 605 may change levels within the test run during a quiet phase. This may be employed to first write levels 0 and 1, and then write levels 2 and 3.

Figure 7:
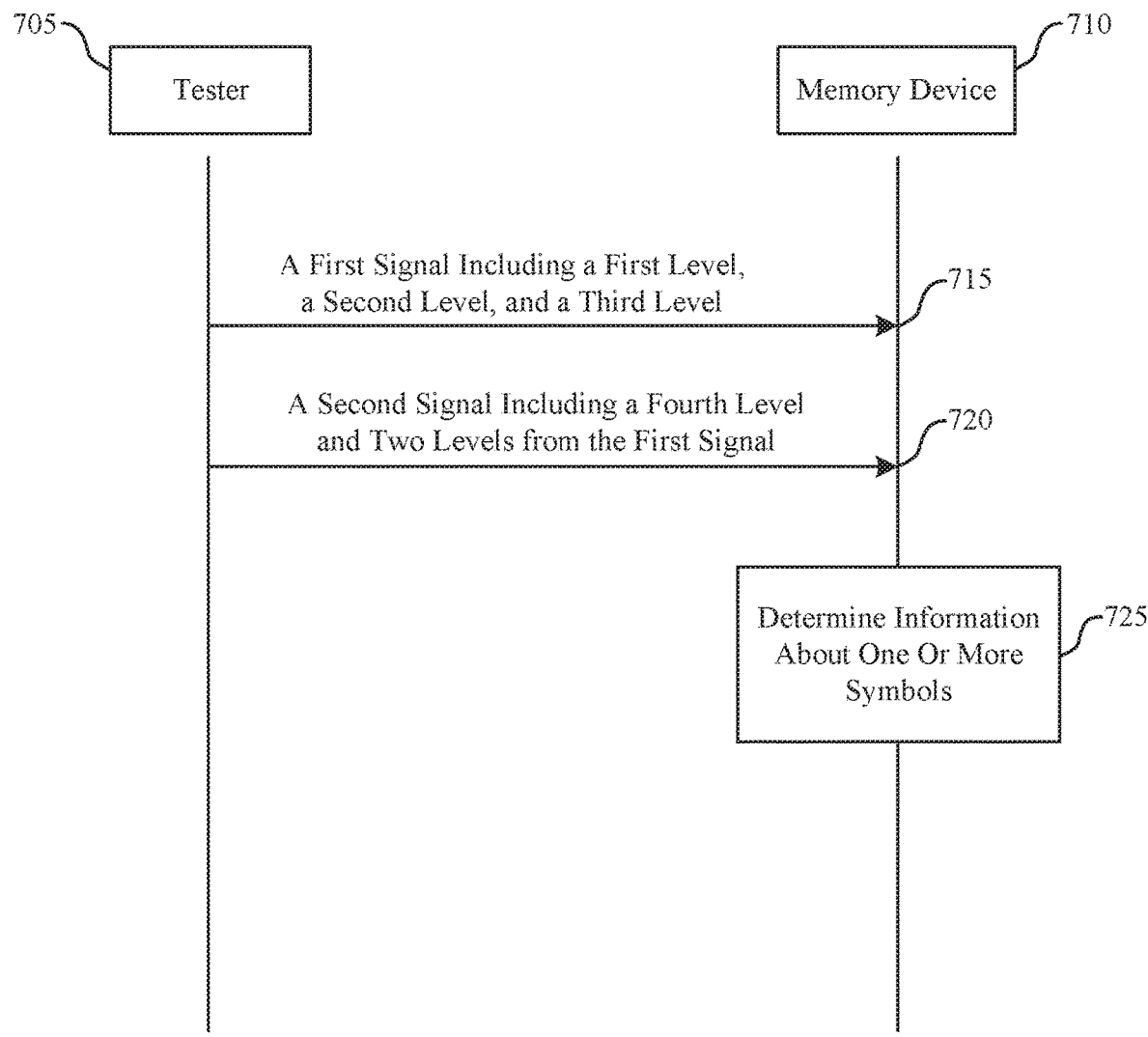
FIG. 7 illustrates an example of a process flow that supports m signaling for a memory device in accordance with examples as disclosed herein.

FIG. 7 illustrates an example of a process flow 700 that supports multi-level signaling for a memory device in accordance with examples as disclosed herein. The process flow 700 may illustrate functions of and communications between a tester 705 and a memory device 710. In some examples, the tester 705 may be an example of the testers 305, 405, or 505 described with reference to FIGS. 3, 4, and 5. In some examples, the memory device 710 which may be examples of the memory devices 110, 310, 406 or memory die 200 described with reference to FIGS. 1 through 4. In some examples, the tester 705 may be ATE and may include at least a driver. FIG. 7 may include a tri-state driver. At 715, the memory device 710 may receive, from a driver, a first signal which may include a first level, a second level, and a third level which may be modulated using a first modulation scheme having three or fewer levels.

At 720, the memory device 710 may receive, from the driver, a second signal which may include a fourth level and two levels from a set that may include the first level, the second level, and the third level. Additionally, the second signal may be modulated using the first modulation scheme.

At 725, the memory device 710, may determine information about one or more symbols of a second modulation scheme which may include at least four levels and may be PAM4. Determining information about the one or more symbols of the second modulation scheme may be based at least partially on receiving the first level, the second level, the third level, the fourth level, and the two levels selected from the set, the memory device being operable to receive one or more signals modulated using the second modulation scheme.

In some examples, the driver may be a tri-state driver, which may be employed to create three levels. In this example, any of the techniques described herein, may be employed in conjunction with a tri-state driver. The three levels of the tri-state driver may include a high level, a low level, and a mid-level which may fall between the high level and the low level. In some examples, it may be decided which three levels of the four levels of PAM4 signaling may be used for testing. In some examples, a first test may employ the first level, second level, and the third level. A second test may employ different levels than the first test the second level, third level, and fourth level). Any combination of levels may be employed by a test using the tri-state driver. Different tests may use different levels until the appropriate quantity of combinations may be provided for testing the input into the memory device 406 (e.g., testing a PAM4 input). Advantageously, the PAM4 input may be captured in two passes using three levels, where using adjacent levels or two levels, three passes may be used to achieve a PAM4 input.

Figure 8:
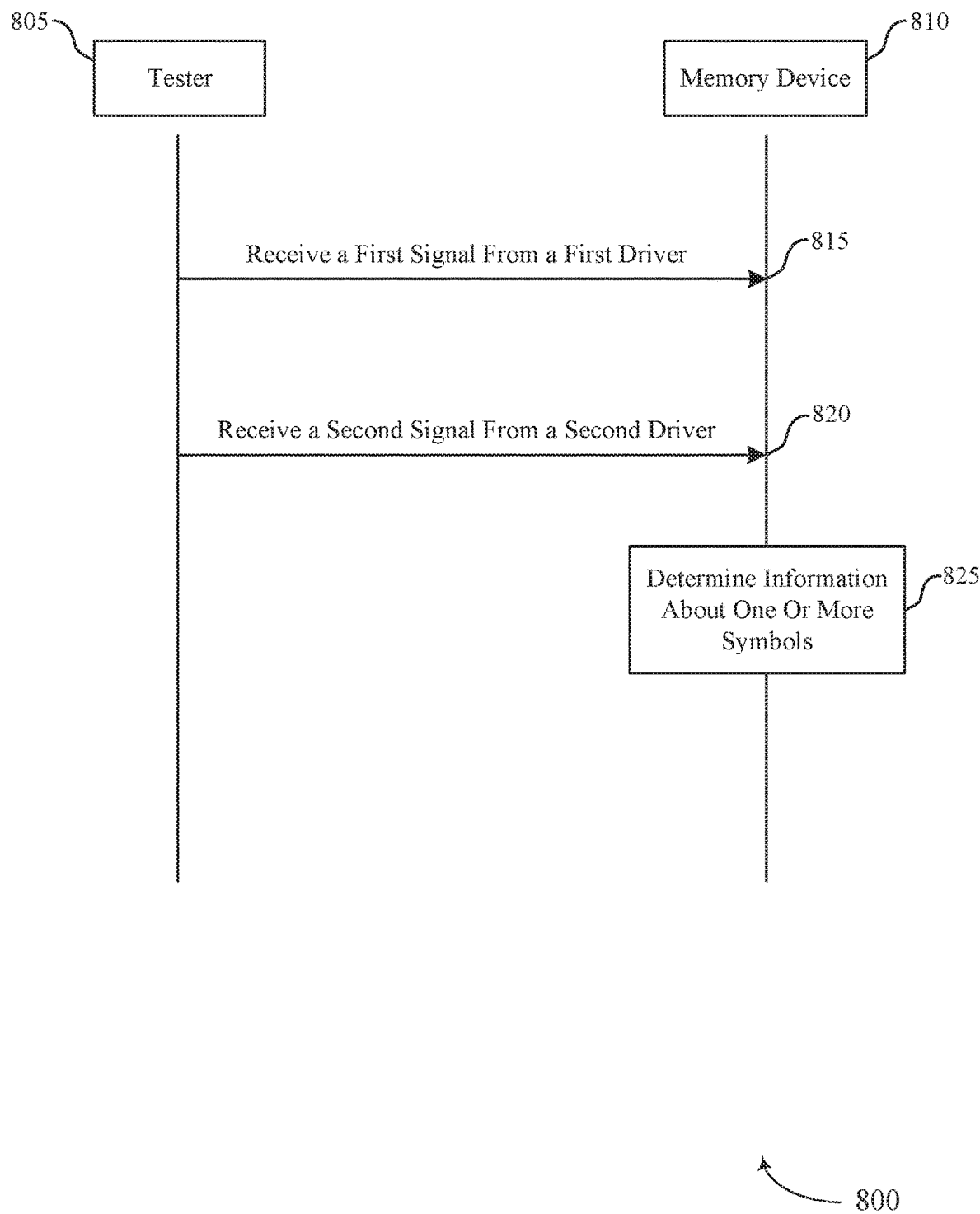
FIG. 8 illustrates an examples of a process flow that supports multi-level signaling for a memory device in accordance with examples as disclosed herein.

FIG. 8 illustrates an example of a process flow 800 that supports multi-level signaling for a memory device in accordance with examples as disclosed herein. The process flow 800 may illustrate functions of and communications between a tester 805 and a memory device 810. In some examples, the tester 805 may be an example of the testers 305, 405, or 505 described with reference to FIGS. 3, 4, and 5. In some examples, the memory device 510 which may be examples of the memory devices 110, 310, 406 or memory die 200 described with reference to FIGS. 1 through 4. In some examples, the tester 805 may be ATE and may include at least a first and second driver. At 815, the memory device 810 may receive at a pin of a memory device and from a first driver, a first signal which may be modulated using a first modulation scheme having three or fewer levels and over a first conductive line or tester channel.

At 820, the memory device 810 may receive at the pin of the memory device and from a second driver, a second signal which may be modulated using the first modulation scheme having three or fewer levels over a second conductive line.

At 825, the memory device 810 may determine information about one or more symbols of a third modulation scheme which may have at least four levels which may be at least partially based on receiving the first signal from the first driver and receiving the second signal from the second driver. In some examples, the first signal and the second signal may be received during a same duration.

In some examples of FIG. 8, the first and second drivers may be PAM2 drivers which may be used as a PAM4 driver by using the existing PAM2 tester channels to transmit to a single data line of the memory device 110. In some examples, dual-transmission lines or triple transmission lines may be employed with the two P2 drivers and existing tester channels. The configuration of the drivers, tester channels, and data lines of the memory device may depend on the capabilities of the tester channels. For example, the tester channels may be input/output or input or output. In some examples, each tester channel may be input or output and a triple transmission line configuration may be employed. In this example, two of the tester channels may provide the PAM4 input to the memory device 406 and one, two, or three of the tester channels may be used to receive the signal from the memory device 406 In some examples, the tester 805 may be bidirectional. In this example, another driver may be added next to the comparator of the tester 805, or additionally or alternatively, an additional comparator may be added next to the driver of the tester 805. In these examples, during a read operation, comparators may be provided in parallel. In some examples, an additional driver may be added to both the comparator and the driver in conjunction with the use of a triple transmission line. In FIG. 8, tester channels may both transmit and receive in the tester 805.

In some examples PAM2 tester channels may be used to generate aggressor signals configured to cause interference with one or more victim signals communicated across other conductive lines. Using aggressor signals and victim signals, the tester 405 any be capable of testing the performance of the memory device 406 under adverse conditions. In some examples, a DQ1 data pin of the memory device 110 may receive a PAM4 tester channel, and the other tester channels received by the memory device 110 may be PAM2 tester channels. The PAM2 signals transmitted on the tester channels may be received by the memory device as full swing levels and the PAM4 tester channel signaling may be received at the memory device as the victim levels, such that any sequence may be programmed with any level arbitrarily to provide the appropriate symbols to the memory device 406. In some examples, the full swing levels may be the highest and lowest level that the memory device is capable of receiving or the highest and lowest level that the tester channel may be configured to transmit to the memory device. Because aggressor tester channels may be driven by the maximum allowed swing, a maximum level of cross talk may be created to the victim tester channels. In some examples, the worst case cross talk for victim tester channels may not be clear due to the influence of ISI. In some cases, a signal modulated using a modulation scheme that includes three or more levels may be used as a victim signal.

Figure 9:
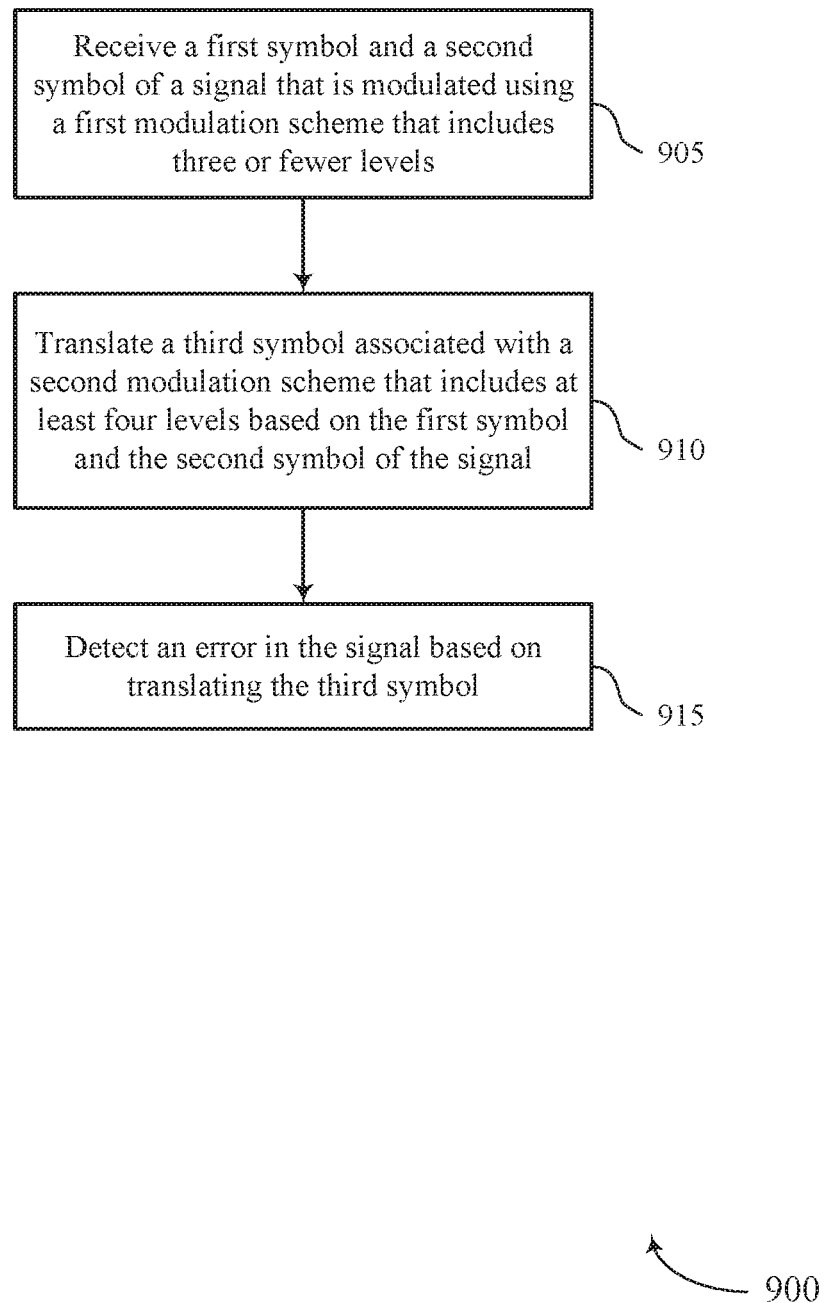
FIGS. 9 through 12 show flowcharts illustrating a method or methods that support multi-level signaling for a memory device in accordance with examples as disclosed herein.

FIG. 9 shows a flowchart illustrating a method or methods 900 that supports multi-level signaling for a memory device in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the memory device to perform the described functions. Additionally or alternatively, a memory device may perform aspects of the described functions using special-purpose hardware.

At 905, the memory device may receive a first symbol and a second symbol of a signal that is modulated using a first modulation scheme that includes three or fewer levels. The operations of 905 may be performed according to the methods described herein. In some examples, aspects of the operations of 905 may be performed by a memory device as described with reference to FIGS. 1 through 8.

At 910, the memory device may translate a third symbol associated with a second modulation scheme that includes at least four levels based on the first symbol and the second symbol of the signal. The operations of 910 may be performed according to the methods described herein. In some examples, aspects of the operations of 910 may be performed by a memory device as described with reference to FIGS. 1 through 8.

At 915, the memory device may detect an error in the signal based on translating the third symbol. The operations of 915 may be performed according to the methods described herein. In some examples, aspects of the operations of 915 may be performed by a memory device as described with reference to FIGS. 1 through 8.

In some examples, an apparatus as described herein may perform a method or methods, such as the method 900. The apparatus may include features, means, or instructions e.g., a non-transitory computer-readable medium storing instructions executable by a processor) for receiving a first symbol and a second symbol of a signal that is modulated using a first modulation scheme that includes three or fewer levels, identifying a third symbol associated with a second modulation scheme that includes at least four levels based on the first symbol and the second symbol of the signal, and detecting an error in the signal based on identifying the third symbol.

Some examples of the method, apparatuses, and non-transitory computer-readable medium described herein may further include operations, features, means, or instructions for receiving a second mapping between the at least one symbol of the first modulation scheme and the at least one symbol of the second modulation scheme, where translating the third symbol may be based on the second mapping.

In some examples of the method, apparatuses, and non-transitory computer-readable medium described herein, receiving the signal further may include operations, features, means, or instructions for receiving a set of signals over a set of pins of a memory device, where the set of signals includes the signal, and detecting the error further may include operations, features, means, or instructions for determining whether each signal of the set received over the set of pins includes one or more errors.

Some examples of the method, apparatuses, and non-transitory computer-readable medium described herein may further include operations, features, means, or instructions for transmitting, to a tester, a message indicating the error detected in the signal based on translating the third symbol.

Figure 10:
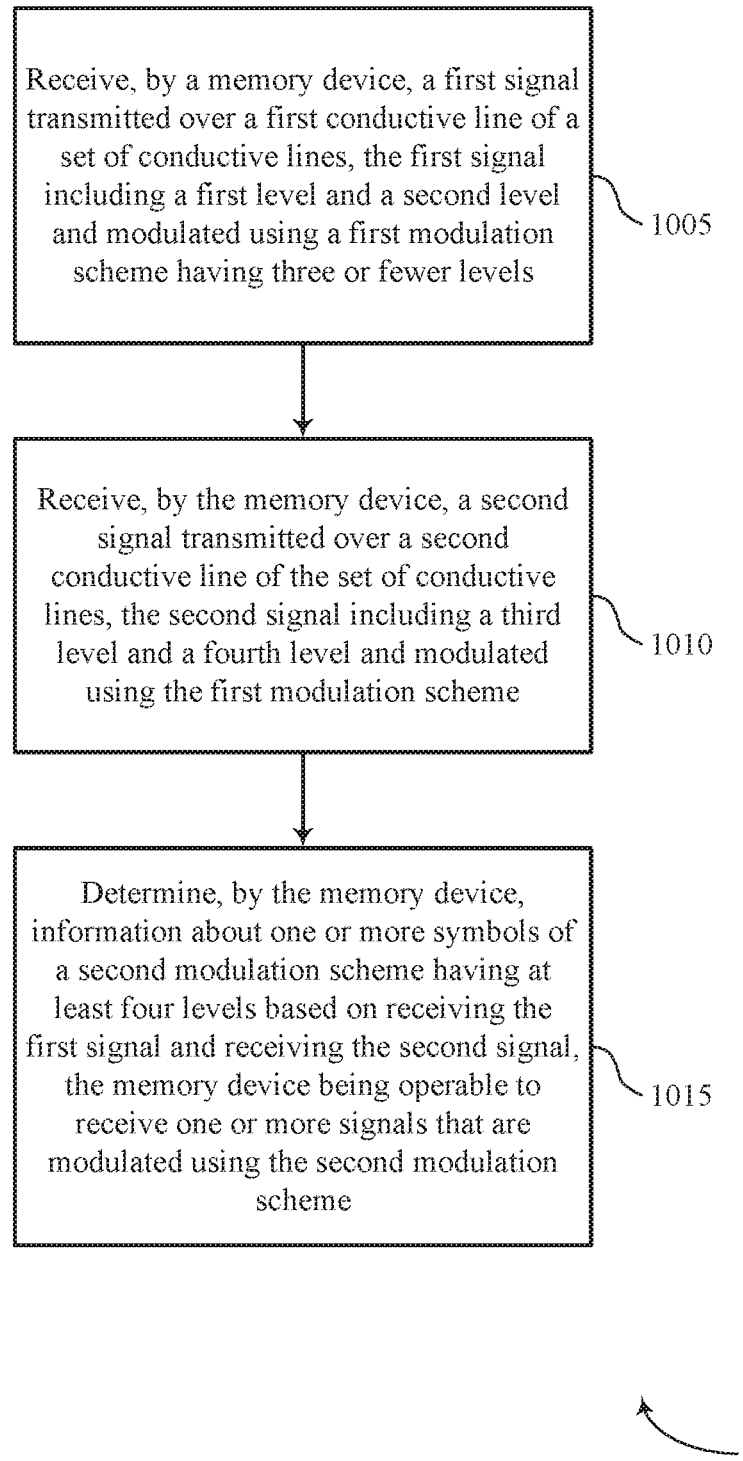

FIG. 10 shows a flowchart illustrating a method or methods 1000 that supports multi-level signaling for a memory device in accordance with examples as disclosed herein. The operations of method. 1000 may be implemented by a memory device or its components as described herein. For example, the operations of method 1000 may be performed by a memory device as described with reference to FIGS. 1 through 8. In some examples, a memory device may execute a set of instructions to control the functional elements of the memory device to perform the described functions. Additionally or alternatively, a memory device may perform aspects of the described functions using special-purpose hardware.

At 1005, the memory device may receive, by a memory device, a first signal transmitted over a first conductive line of a set of conductive lines, the first signal including a first level and a second level and modulated using a first modulation scheme having three or fewer levels. The operations of 1005 may be performed according to the methods described herein. In some examples, aspects of the operations of 1005 may be performed by a memory device as described with reference to FIGS. 1 through 8.

At 1010, the memory device may receive, by the memory device, a second signal transmitted over a second conductive line of the set of conductive lines, the second signal including a third level and a fourth level and modulated using the first modulation scheme. The operations of 1010 may be performed according to the methods described herein. In some examples, aspects of the operations of 1010 may be performed by a memory device as described with reference to FIGS. 1 through 8.

At 1015, the memory device may determine, by the memory device, information about one or more symbols of a second modulation scheme having at least four levels based on receiving the first signal and receiving the second signal, the memory device being operable to receive one or more signals that are modulated using the second modulation scheme. The operations of 1015 may be performed according to the methods described herein. In some examples, aspects of the operations of 1015 may be performed by a memory device as described with reference to FIGS. 1 through 8.

In some examples, an apparatus as described herein may perform a method or methods, such as the method 1000. The apparatus may include features, means, or instructions (e.g., a non-transitory computer-readable medium storing instructions executable by a processor) for receiving, by a memory device from a driver, a first signal transmitted over a first conductive line of a set of conductive lines, the first signal including a first level and a second level and modulated using a first modulation scheme having three or fewer levels, receiving, by the memory device from the driver, a second signal transmitted over a second conductive line of the set of conductive lines, the second signal including a third level and a fourth level and modulated using the first modulation scheme, and determining, by the memory device, information about one or more symbols of a second modulation scheme having at least four levels based on receiving the first signal and receiving the second signal, the memory device being operable to receive one or more signals that are modulated using the second modulation scheme.

Some examples of the method, apparatuses, and non-transitory computer-readable medium described herein may further include operations, features, means, or instructions for receiving, by the memory device from a driver, a third signal including at least one of the first level, the second level, the third level, or the fourth level over a third conductive line of the set of conductive lines, where determining the information about the one or more symbols of the second modulation scheme may be based on receiving the third signal over the third conductive line.

In some examples of the method, apparatuses, and non-transitory computer-readable medium described herein, the first level, the second level, the third level, and the fourth level correspond to at least four different levels of the second modulation scheme.

In some examples of the method, apparatuses, and non-transitory computer-readable medium described herein, the first level and the second level are a first set of adjacent levels in the first modulation scheme and the third level and the fourth level are a second set of adjacent levels in the first modulation scheme.

In some examples of the method, apparatuses, and non-transitory computer-readable medium described herein, the first level and the second level are a first set of adjacent levels in the first modulation scheme and the third level and the fourth level are a second set of adjacent levels in the first modulation scheme, wherein at least one level of the first set is included in the second set.

In some examples of the method, apparatuses, and non-transitory computer-readable medium described herein, the first level and the second level of the first signal includes a full swing of levels associated with the first modulation scheme or the second modulation scheme.

In some examples of the method, apparatuses, and non-transitory computer-readable medium described herein, the second signal is modulated using the second modulation scheme.

Some examples of the method, apparatuses, and non-transitory computer-readable medium described herein may further include operations, features, means, or instructions for detecting interference on the second signal by the first signal, where the first signal may be for inducing signals on other conductive lines.

In some examples of the method, apparatuses, and non-transitory computer-readable medium described herein, the first level and the second level comprise a full swing of levels associated with the second modulation scheme, and the third level and the fourth level are adjacent levels in the first modulation scheme between the first level and the second level.

Figure 11:
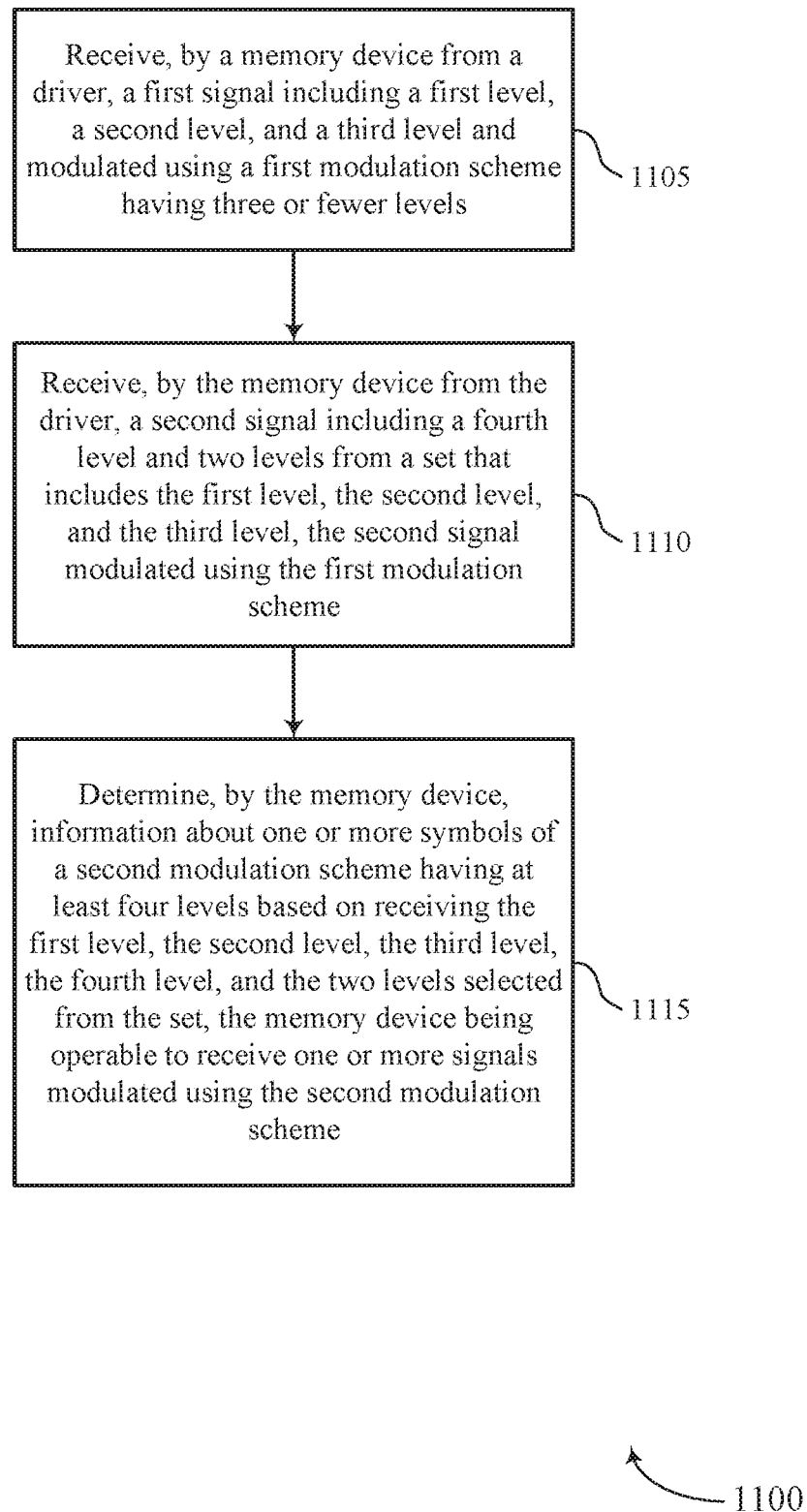

FIG. 11 shows a flowchart illustrating a method or methods 1100 that support multi-level signaling for a memory device in accordance with examples as disclosed herein. The operations of method 1100 may be implemented by a memory device or its components as described herein. For example, the operations of method 1100 may be performed by a memory device as described with reference to FIGS. 1 through 8. In some examples, a memory device may execute a set of instructions to control the functional elements of the memory device to perform the described functions. Additionally or alternatively, a memory device may perform aspects of the described functions using special-purpose hardware.

At 1105, the memory device may receive, by a memory device from a driver, a first signal including a first level, a second level, and a third level and modulated using a first modulation scheme having three or fewer levels. The operations of 1105 may be performed according to the methods described herein. In some examples, aspects of the operations of 1105 may be performed by a memory device as described with reference to FIGS. 1 through 8.

At 1110, the memory device may receive, by the memory device from the driver, a second signal including a fourth level and two levels from a set that includes the first level, the second level, and the third level, the second signal modulated using the first modulation scheme. The operations of 1110 may be performed according to the methods described herein. In some examples, aspects of the operations of 1110 may be performed by a memory device as described with reference to FIGS. 1 through 8.

At 1115, the memory device may determine, by the memory device, information about one or more symbols of a second modulation scheme having at least four levels based on receiving the first level, the second level, the third level, the fourth level, and the two levels selected from the set, the memory device being operable to receive one or more signals modulated using the second modulation scheme. The operations of 1115 may be performed according to the methods described herein. In some examples, aspects of the operations of 1115 may be performed by a memory device, as described with reference to FIGS. 1 through 8.

In some examples, an apparatus as described herein may perform a method or methods, such as the method 1100. The apparatus may include features, means, or instructions (e.g., a non-transitory computer-readable medium storing instructions executable by a processor) for receiving, by a memory device from a driver, a first signal including a first level, a second level, and a third level and modulated using a first modulation scheme having three or fewer levels, receiving, by the memory device from the driver, a second signal including a fourth level and two levels from a set that includes the first level, the second level, and the third level, the second signal modulated using the first modulation scheme, and determining, by the memory device, information about one or more symbols of a second modulation scheme having at least four levels based on receiving the first level, the second level, the third level, the fourth level, and the two levels selected from the set, the memory device being operable to receive one or more signals modulated using the second modulation scheme.

In some examples of the method, apparatuses, and non-transitory computer-readable medium described herein, the first signal and the second signal include at least two of the same levels.

In some examples of the method, apparatuses, and non-transitory computer-readable medium described herein, the first signal and the second signal together comprise a full swing of levels associated with the second modulation scheme.

In some examples of the method, apparatuses, and non-transitory computer-readable medium described herein, the first signal includes at least a full swing of levels associated with the second modulation scheme.

In some examples of the method, apparatuses, and non-transitory computer-readable medium described herein, the first signal includes adjacent levels in the first modulation scheme and the second signal includes adjacent levels in the first modulation scheme.

Figure 12:
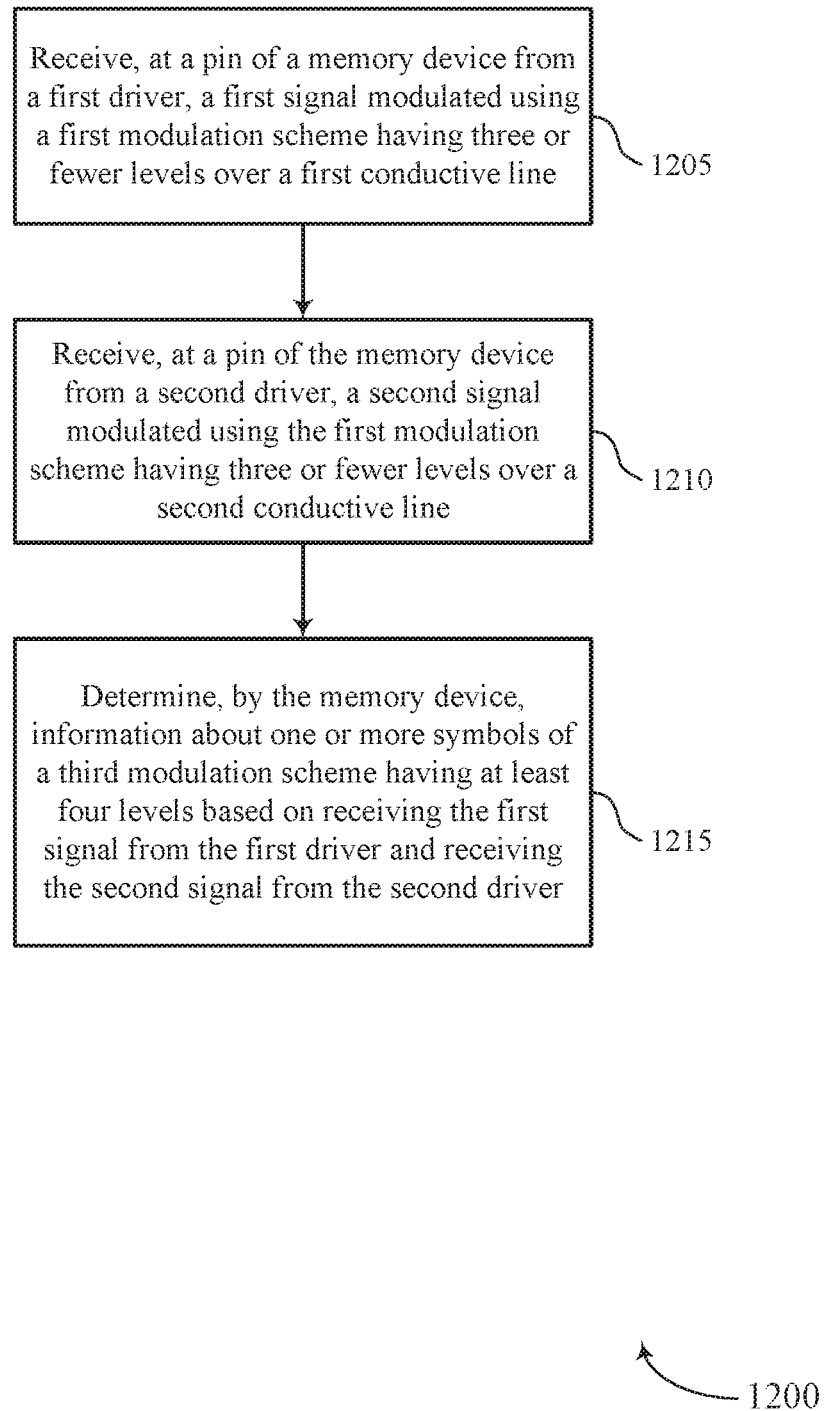

FIG. 12 shows a flowchart illustrating a method or methods 1200 that supports multi-level signaling for a memory device in accordance with examples as disclosed herein. The operations of method 1200 may be implemented by a memory device or its components as described herein. For example, the operations of method 1200 may be performed by a memory device as described with reference to FIGS. 1 through 8. In some examples, a memory device may execute a set of instructions to control the functional elements of the memory device to perform the described functions. Additionally or alternatively, a memory device may perform aspects of the described functions using special-purpose hardware.

At 1205, the memory device may receive, at a pin of a memory device from a first driver, a first signal modulated using a first modulation scheme having three or fewer levels over a first conductive line. The operations of 1205 may be performed according to the methods described herein. In some examples, aspects of the operations of 1205 may be performed by a memory device as described with reference to FIGS. 1 through 8.

At 1210, the memory device may receive, at the pin of the memory device from a second driver, a second signal modulated using the first modulation scheme having three or fewer levels over a second conductive line. The operations of 1210 may be performed according to the methods described herein. In some examples, aspects of the operations of 1210 may be performed by a memory device as described with reference to FIGS. 1 through 8.

At 1215, the memory device may determine, by the memory device, information about one or more symbols of a third modulation scheme having at least four levels based on receiving the first signal from the first driver and receiving the second signal from the second driver. The operations of 1215 may be performed according to the methods described herein. In some examples, aspects of the operations of 1215 may be performed by a memory device as described with reference to FIGS. 1 through 8.

In some examples, an apparatus as described herein may perform a method or methods, such as the method 1200. The apparatus may include features, means, or instructions (e.g., a non-transitory computer-readable medium storing instructions executable by a processor) for receiving, by a memory device from a first driver, a first signal modulated using a first modulation scheme having three or fewer levels over a first conductive line, receiving, by the memory device from a second driver, a second signal modulated using the first modulation scheme having three or fewer levels over a second conductive line, and determining, by the memory device, information about one or more symbols of a third modulation scheme having at least four levels based on receiving the first signal from the first driver and receiving the second signal from the second driver.

Some examples of the method, apparatus, and non-transitory computer-readable medium described herein may further include operations, features, means, or instructions for receiving, at the pin of the memory device from a third driver, a third signal modulated using the first modulation scheme having three or fewer levels over a third conductive line, and determining, by the memory device, the information about the one or more symbols of the third modulation scheme based in part on receiving the first, second, and third signals.

In some examples of the method, apparatuses, and non-transitory computer-readable medium described herein, at least two of the first conductive line, the second conductive line, and the third conductive line are configured to receive signaling at the memory device and at least the other one of the first conductive line, the second conductive line, and the third conductive line is configured to transmit information from the memory device.

In some examples of the method, apparatuses, and non-transitory computer-readable medium described herein, the first and second conductive lines are input lines to the memory device and the first conductive line, the second conductive line, and the third conductive line are input and output lines to and from the memory device, respectively.

In some examples of the method, apparatuses, and non-transitory computer-readable medium described herein, the first signal includes a first level and a second level that may be adjacent to one another in the first modulation scheme, where the second signal includes a third level, and where the third signal includes a fourth level, and the third level and the fourth level include a full swing of levels associated with the third modulation scheme.

In some examples of the method, apparatuses, and non-transitory computer-readable medium described herein, the first level and the second level are different than the third level and the fourth level.

In some examples of the method, apparatuses, and non-transitory computer-readable medium described herein, one of the first level or the second level is the same as one of the third level or the fourth level.

Some examples of the method, apparatuses, and non-transitory computer-readable medium described herein may further include operations, features, means, or instructions for receiving the first signal and the second signal during a same duration based on receiving the first signal and the second signal on the first conductive line and the second conductive line, respectively.

In some examples of the method, apparatuses, and non-transitory computer-readable medium described herein, the first signal includes a first level and a second level that may be adjacent to one another in the first modulation scheme, and the second signal includes a third level and a fourth level, where the third and the fourth level include a full swing of levels associated with the third modulation scheme.

It should be noted that the methods described herein describe possible implementations, and that the operations and the steps may be rearranged or otherwise modified and that other implementations are possible. Furthermore, aspects from two or more of the methods may be combined.

Information signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary, skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

As used herein, the term "substantially" means that the modified characteristic (e.g., a verb or adjective modified by the term substantially)) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices described herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor described herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are signals), then the FET may be referred to as a n-type FET. If the channel is p-type majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DST, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Btu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

receiving, at a memory device, a first symbol and a second symbol of a signal that is modulated using a first modulation scheme that includes three or fewer levels;

translating a mapping between at least one symbol of the signal modulated using the first modulation scheme and at least one symbol of a second modulation scheme;

translating, at the memory device and based at least in part on the mapping, the first symbol and the second symbol into a third symbol associated with the second modulation scheme that includes at least four levels; and detecting an error in the signal based at least in part on translating the third symbol.

2. The method of claim 1, further comprising:

receiving a second mapping between the at least one symbol of the first modulation scheme and the at least one symbol of the second modulation scheme, wherein translating the third symbol is based at least in part on the second mapping.

3. The method of claim 1, wherein:

receiving the signal further comprises receiving a plurality of signals over a plurality of pins of the memory device, wherein the plurality of signals comprises the signal; and detecting the error further comprises determining whether each signal of the plurality of signals received over the plurality of pins includes one or more errors.

4. The method of claim 1, further comprising:

transmitting, to a tester, a message indicating the error detected in the signal based at least in part on translating the third symbol.

5. A method, comprising:

receiving, by a memory device over a first conductive line of a plurality of conductive lines, a first signal comprising a first level and a second level and modulated using a first modulation scheme having three or fewer levels;

receiving, by the memory device over a second conductive line of the plurality of conductive lines, a second signal comprising a third level and a fourth level and modulated using the first modulation scheme;

receiving, by the memory device from a driver, a third signal comprising at least one of the first level, the second level, the third level, or the fourth level over a third conductive line of the plurality of conductive lines; and determining, by the memory device and based at least in part on receiving the third signal over the third conductive line, information about one or more symbols of a second modulation scheme having at least four levels based at least in part on receiving the first signal and receiving the second signal, the memory device being operable to receive one or more signals that are modulated using the second modulation scheme.

6. The method of claim 5, wherein the first level, the second level, the third level, and the fourth level correspond to at least four different levels of the second modulation scheme.

7. The method of claim 5, wherein the first level and the second level are a first set of adjacent levels in the first modulation scheme and the third level and the fourth level are a second set of adjacent levels in the first modulation scheme.

8. The method of claim 5, wherein the first level and the second level are a first set of adjacent levels in the first modulation scheme and the third level and the fourth level are a second set of adjacent levels in the first modulation scheme, wherein at least one level of the first set is included in the second set.

9. The method of claim 5, wherein the first level and the second level of the first signal comprises a full swing of levels associated with the first modulation scheme or the second modulation scheme.

10. The method of claim 5, wherein the second signal is modulated using the second modulation scheme.

11. The method of claim 10, further comprising:
detecting interference on the second signal by the first signal, wherein the first signal is for inducing signals on other conductive lines.

12. The method of claim 5, wherein the first level and the second level comprise a full swing of levels associated with the second modulation scheme, and the third level and the fourth level are adjacent levels in the first modulation scheme between the first level and the second level.

13. A method, comprising:
receiving, by a memory device from a driver over a first conductive line of a plurality of conductive lines, a first signal comprising a first level, a second level, and a third level and modulated using a first modulation scheme having three or fewer levels;
receiving, by the memory device from the driver over a second conductive line of the plurality of conductive lines, a second signal comprising a fourth level and two levels from a set that comprises the first level, the second level, and the third level, the second signal modulated using the first modulation scheme;
receiving, by the memory device from the driver, a third signal comprising at least one of the first level, the second level, the third level, or the fourth level over a third conductive line of the plurality of conductive lines; and
determining, by the memory device and based at least in part on receiving the third signal, information about one or more symbols of a second modulation scheme having at least four levels based at least in part on receiving the first level, the second level, the third level, the fourth level, and the two levels selected from the set, the memory device being operable to receive one or more signals modulated using the second modulation scheme.

14. The method of claim 13, wherein the first signal and the second signal include at least two of the same levels.

15. The method of claim 13, wherein the first signal and the second signal together comprise a full swing of levels associated with the second modulation scheme, or wherein the first signal comprises at least a full swing of levels associated with the second modulation scheme.

16. The method of claim 13, wherein the first signal comprises adjacent levels in the first modulation scheme and the second signal comprises adjacent levels in the first modulation scheme.

17. A method, comprising:
receiving, at a pin of a memory device from a first driver, a first signal comprising a first level and a second level over a first conductive line modulated using a first modulation scheme having three or fewer levels;
receiving, at the pin of the memory device from a second driver, a second signal comprising a third level and a fourth level over a second conductive line modulated using the first modulation scheme having three or fewer levels;
receiving, at the pin of the memory device from a third driver, a third signal comprising at least one of the first level, the second level, the third level, or the fourth level over a third conductive line; and
determining, by the memory device and based at least in part of receiving the third signal, information about one or more symbols of a third modulation scheme having at least four levels based at least in part on receiving the first signal from the first driver and receiving the second signal from the second driver.

18. The method of claim 17, further comprising:
receiving, at the pin of the memory device from a third driver, a third signal modulated using the first modulation scheme having three or fewer levels over a third conductive line; and
determining, by the memory device, the information about the one or more symbols of the third modulation scheme based in part on receiving the first, second, and third signals.

19. The method of claim 18, wherein at least two of the first conductive line, the second conductive line, and the third conductive line are configured to receive signaling at the memory device and at least the other one of the first conductive line, the second conductive line, and the third conductive line is configured to transmit information from the memory device.

20. The method of claim 18, wherein the first and second conductive lines are input lines to the memory device and the first conductive line, the second conductive line, and the third conductive line are input and output lines to and from the memory device, respectively.

21. The method of claim 18, wherein the first signal comprises a first level and a second level that are adjacent to one another in the first modulation scheme, wherein the second signal comprises a third level, and wherein the third signal comprises a fourth level, and the third level and the fourth level comprise a full swing of levels associated with the third modulation scheme.

22. The method of claim 21, wherein the first level and the second level are different than the third level and the fourth level, or wherein one of the first level or the second level is the same as one of the third level or the fourth level.

23. The method of claim 17, further comprising:
receiving the first signal and the second signal during a same duration based at least in part on receiving the first signal and the second signal on the first conductive line and the second conductive line, respectively.

24. The method of claim 17, wherein:
the first signal comprises a first level and a second level that are adjacent to one another in the first modulation scheme; and
the second signal comprises a third level and a fourth level, wherein the third and the fourth level comprise a full swing of levels associated with the third modulation scheme.

25. The method of claim 1, wherein translating the mapping comprises receiving the mapping from a tester.

* * * * *